(12) United States Patent
Tan et al.

(10) Patent No.: US 10,345,339 B2
(45) Date of Patent: Jul. 9, 2019

(54) GROUP DELAY BASED AVERAGING

(71) Applicant: Tektronix, Inc., Beaverton, OR (US)

(72) Inventors: Kan Tan, Portland, OR (US); John J. Pickerd, Hillsboro, OR (US)

(73) Assignee: Tektronix, Inc., Beaverton, OR (US)

( * ) Notice: Subject to any disclaimer, the term of this patent is extended or adjusted under 35 U.S.C. 154(b) by 475 days.

(21) Appl. No.: 15/143,429

(22) Filed: Apr. 29, 2016

(65) Prior Publication Data

US 2017/0168092 A1    Jun. 15, 2017

Related U.S. Application Data

(60) Provisional application No. 62/265,325, filed on Dec. 9, 2015.

(51) Int. Cl.
  *G01R 13/02*    (2006.01)
  *G01R 19/25*    (2006.01)
  *G01R 23/175*    (2006.01)

(52) U.S. Cl.
  CPC ....... *G01R 13/029* (2013.01); *G01R 13/0218* (2013.01); *G01R 19/2509* (2013.01); *G01R 23/175* (2013.01)

(58) Field of Classification Search
  CPC .......................... G01R 13/029; G01R 13/0218
  See application file for complete search history.

(56) References Cited

U.S. PATENT DOCUMENTS

| 6,094,627 A | 7/2000 | Peck et al. |
| 6,618,385 B1 * | 9/2003 | Cousins ................. H04L 47/15 370/230 |

(Continued)

FOREIGN PATENT DOCUMENTS

| EP | 0614281 | 9/1994 |
| EP | 2224611 | 9/2010 |

(Continued)

OTHER PUBLICATIONS

European Patent Office, Extended European Search Report and Written Opinion for European Patent Application No. 16203170.2, dated Apr. 25, 2017, 12 pages, Munich, Germany.

(Continued)

*Primary Examiner* — Marc Anthony Armand
(74) *Attorney, Agent, or Firm* — Miller Nash Graham & Dunn; Andrew J. Harrington

(57) ABSTRACT

Embodiments of the present invention provide techniques and methods for improving signal-to-noise ratio (SNR) when averaging two or more data signals by finding a group delay between the signals and using it to calculate an averaged result. In one embodiment, a direct average of the signals is computed and phases are found for the direct average and each of the data signals. Phase differences are found between each signal and the direct average. The phase differences are then used to compensate the signals. Averaging the compensated signals provides a more accurate result than conventional averaging techniques. The disclosed techniques can be used for improving instrument accuracy while minimizing effects such as higher-frequency attenuation. For example, in one embodiment, the disclosed techniques may enable a real-time oscilloscope to take more accurate S parameter measurements.

20 Claims, 6 Drawing Sheets

(56) References Cited

U.S. PATENT DOCUMENTS

| | | | |
|---|---|---|---|
| 2007/0086713 A1* | 4/2007 | Ingmar | G02F 1/365 |
| | | | 385/122 |
| 2007/0245028 A1* | 10/2007 | Baxter | H04L 29/06027 |
| | | | 709/228 |
| 2009/0046003 A1 | 2/2009 | Tung | |
| 2010/0174190 A1* | 7/2010 | Hancock | A61B 5/02007 |
| | | | 600/443 |
| 2012/0243597 A1 | 9/2012 | Currivan | |
| 2013/0076372 A1 | 3/2013 | Dascher | |
| 2014/0257730 A1 | 9/2014 | Czompo | |
| 2015/0084656 A1 | 3/2015 | Pickerd et al. | |
| 2015/0293231 A1* | 10/2015 | Weed | G01S 19/04 |
| | | | 342/357.41 |
| 2016/0018450 A1 | 1/2016 | Tan et al. | |

FOREIGN PATENT DOCUMENTS

| | | |
|---|---|---|
| EP | 2881947 | 6/2015 |
| JP | 2004154399 | 6/2004 |

OTHER PUBLICATIONS

Agilent Technologies, Inc., "PrecisionProbe for Bandwidths up to 33GHz," May 18, 2012. Available at http://cp.literature.agilent.com/litweb/pdf/5990-7940EN.pdf.
"PCI Express Base Specification Revision 3.0," Nov. 10, 2010.

* cited by examiner

GROUP DELAY BASED AVERAGING

FIELD OF THE INVENTION

The present invention relates to improved methods for averaging data signals while minimizing distortion caused by effects such as jitter.

BACKGROUND OF THE INVENTION

Direct averaging is often used to improve measurement accuracy in measurement instruments, such as oscilloscopes. By taking the average of multiple signals (or averaging multiple samples acquired from a single signal), the signal-to-noise ratio (SNR) of the result can be increased, since non-repeating noise and distortion are averaged out. But, when the signals have jitter, the averaged result may be distorted. When the signals are averaged, this jitter causes higher-frequency portions of the result to be attenuated more than the rest of the result. This can typically be seen as slower rising edges in the averaged result.

Often, measurement instruments may introduce jitter into the signals that they are measuring. For example, trigger jitter in real-time oscilloscopes introduces jitter into samples acquired by the scope. Thus, these instruments may not be able to make measurements as accurately as more expensive devices, even when averaging is used. Thus, there is a need for improved averaging techniques to minimize the effect that jitter has on the averaged result.

Improved averaging techniques could be useful for a number of different signal processing applications, and might allow instruments with acquisition jitter to replace more expensive instruments. For example, in one embodiment, improved averaging techniques could allow real-time oscilloscopes to measure S-parameters of a device under test.

In one example, the disclosed techniques might allow a real-time oscilloscope to measure S-parameters without needing additional instruments such as a vector network analyzer (VNA). As bit rates increase, high speed serial data link simulation and measurements increasingly need to use S parameters when modeling components in the data link. For example, to fully characterize and simulate the serial data link 100 shown in FIG. 1, the output impedance (represented by reflection coefficient $S_{22}$) of the transmitter (Tx) 105, input impedance (represented by reflection coefficient $S_{11}$) of the receiver (Rx) 115, and the full S parameters ($S_{11}$, $S_{12}$, $S_{21}$, and $S_{22}$) of the channel 110 are all needed.

Traditionally, a vector network analyzer (VNA) or a time-domain reflectometry (TDR) system with a sampling oscilloscope is needed to measure these types of S parameters for two-port or multi-port network characterization. These specialized instruments are often expensive, and are not widely available. In contrast, real-time oscilloscopes are commonly used to debug, test, and measure high speed serial data links. It would be convenient to use real-time oscilloscopes to measure the S parameters of a data link.

Unfortunately, while some previous methods allow a real-time oscilloscope to measure S parameters or related functions, they do not enable the scope to take accurate enough measurements to eliminate the need for additional VNA or sampling oscilloscope-based TDR solutions. For example, one prior art solution by Agilent (described in U.S. patent application Ser. No. 13/247,568 ("the '568 application")) uses precision probes to measure probe impedance and transfer functions for a Device Under Test (DUT). These measurements may then be used to create embed or deembed filters to compensate for the measured system characteristics. But the transfer functions measured using this method do not provide accurate delay information for the DUT. For example, a longer high quality cable may have the same magnitude loss as a shorter but lower-quality cable. But these two cables have very different group delay characteristics. Because the method disclosed in the '568 application does not measure accurate delay information, it is not accurate enough to determine which type of cable is being used.

U.S. patent application Ser. No. 14/673,747 ("the '747 application") does describe a method of measuring full S parameters using a real-time scope, along with a signal generator and a power divider. But the method disclosed in the '747 application is still prone to measurement errors due to trigger jitter that is inherent in real-time scopes.

As discussed above, accuracy of real-time scopes can be improved by using averaging. But real-time scopes have trigger jitter, which causes the higher-frequency portions of the signal to be attenuated more than the rest of the signal. This can typically be seen as slower rising edges in the measured signal. Because prior art averaging solutions do not address this attenuation, they do not enable real time oscilloscopes to make measurements as accurately as other instruments such as VNAs or sampling scopes.

In addition, when a repeating data pattern is averaged, the patterns must all be aligned. Traditionally, the patterns are aligned based on edge crossings, or by using cross-correlation. But noise in the patterns can distort the edge crossings, causing a loss of accuracy in edge-based methods. And cross-correlation is computationally expensive.

Thus, there is a need for improved averaging techniques to take more accurate signal measurements.

SUMMARY OF THE INVENTION

Embodiments of the present invention use group delay to improve the signal-to-noise ratio when averaging multiple signals. This eliminates the distortion that occurs in conventional averaging techniques due to jitter. The disclosed techniques may be used in any application that uses averaging, or by any type of device or instrument. For example, in one embodiment, the disclosed techniques may be used by a real-time oscilloscope to measure S parameters with greater accuracy, despite the scope's inherent trigger jitter. This may allow the real-time oscilloscope to replace more expensive devices. In another embodiment, the disclosed techniques may be used when averaging repetitive data patterns that have been obtained from multiple acquisitions, or when averaging multiple portions of repeating data signals that have been obtained from a single long acquisition. And, because the disclosed techniques are computationally efficient, they may be used by devices that have less processing power.

DETAILED DESCRIPTION OF THE INVENTION

Figure 1:
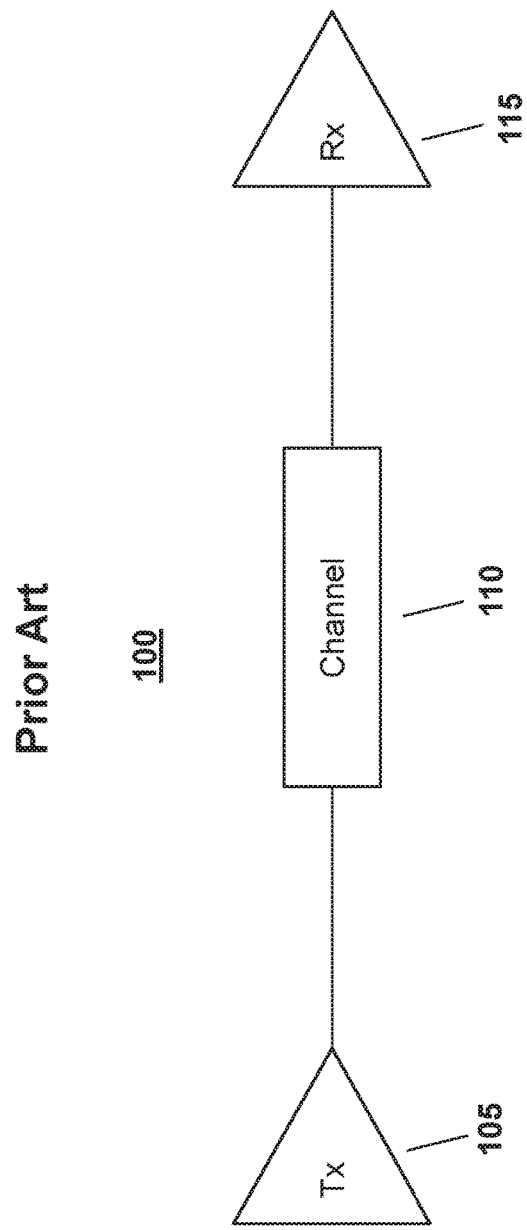
FIG. 1 depicts a prior art high speed serial data link system.

FIG. 1 depicts a high-level block diagram of a serial data link system. Transmitter (Tx) 105 is connected to a receiver (Rx) 115 through a channel 110. As is known in the art, the channel 110 may consist of any physical transmission medium, including copper wire, coaxial cable, optical fiber, or (in the case of wireless transmission) the air. A channel 110 may also consist of multiple mediums.

Real-time oscilloscopes are commonly used to measure characteristics of serial data link systems. As discussed above, the trigger jitter in real time scopes introduces horizontal shifts which cause the higher-frequency portions of the measured signal to be attenuated when averaging is used. The horizontal time shift (also called jitter) between two otherwise identical data signals (e.g., signals a and b) causes a constant group delay between the two signals. This group delay causes a proportional phase difference $\Delta\Phi$ between the two signals. The relationship between time difference $\Delta t$ and phase difference $\Delta\Phi$ can be seen in the following equation:

$$\Delta\Phi(f)=2\pi*f*\Delta t \quad \text{(eq 1)}$$

Figure 2:
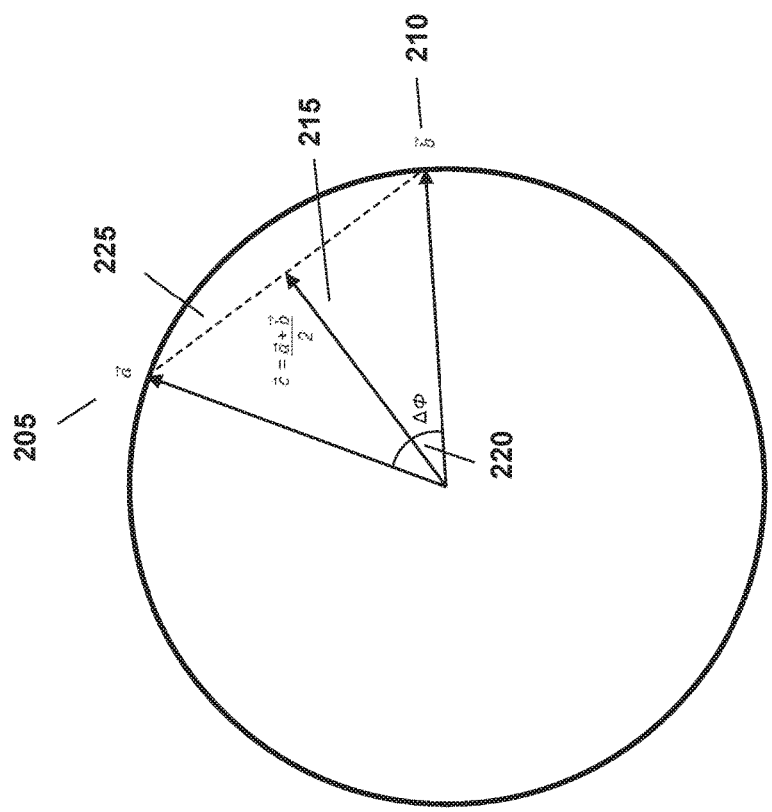
FIG. 2 depicts the phase and magnitude for the average of two vectors.

The impact that these horizontal shifts have on the averaged result can be examined in the frequency domain. At a particular frequency f, each signal may be represented by a vector in complex coordinates, as shown in FIG. 2. In FIG. 2, two data signals a and b are represented by the vectors $\vec{a}$ 205 and $\vec{b}$ 210. The phase difference between $\vec{a}$ 205 and $\vec{b}$ 210 is $\Delta\Phi$ 220.

Taking the direct average of $\vec{a}$ 205 and $\vec{b}$ 210 yields vector $\vec{c}$ 215. As depicted in FIG. 2, vector $\vec{c}$ 215 points to the mid-point of line $\vec{ab}$ 225. The vector $\vec{c}$ 215 is perpendicular to the line $\vec{ab}$ 225, and bisects the angle $\Delta\Phi$. The magnitude of $\vec{c}$ 215 is $\cos(\Delta\Phi/2)$ times the common magnitude of $\vec{a}$ 205 and $\vec{b}$ 210. When $\vec{a}$ 205 and $\vec{b}$ 210 are not in phase (i.e., when $\Delta\Phi$ 220 is not zero), the magnitude of $\vec{c}$ 215 will be less than the common magnitude of $\vec{a}$ 205 and $\vec{b}$ 210.

The disclosed techniques address the time shift between data signals by explicitly measuring and compensating $\Delta t$ before performing the averaging. By compensating the time shifts, the phase difference $\Delta\Phi$ 220 is reduced to zero for all data signals that need to be averaged. So the averaged vector $\vec{c}$ 215 will have the same magnitude as $\vec{a}$ 205 and $\vec{b}$ 210, since $\cos(0)=1$.

According to one embodiment of the present invention, two or more data signals ($x_1, \ldots, x_n$) are acquired and a direct average of all of the data signals $\bar{x}$ is computed. Group delays ($y_1, \ldots, y_n$) are computed for each individual signal ($x_1, \ldots, x_n$) and an average group delay $\bar{y}$ is computed for the average signal $\bar{x}$. Next, the difference between each signal's group delay ($y_1, \ldots, y_n$) and the average group delay $\bar{y}$ is computed. The differences are compensated to create compensated signals ($z_1, \ldots, z_n$). Finally, the compensated signals are averaged together to create an averaged result $\bar{z}$.

Figure 3:
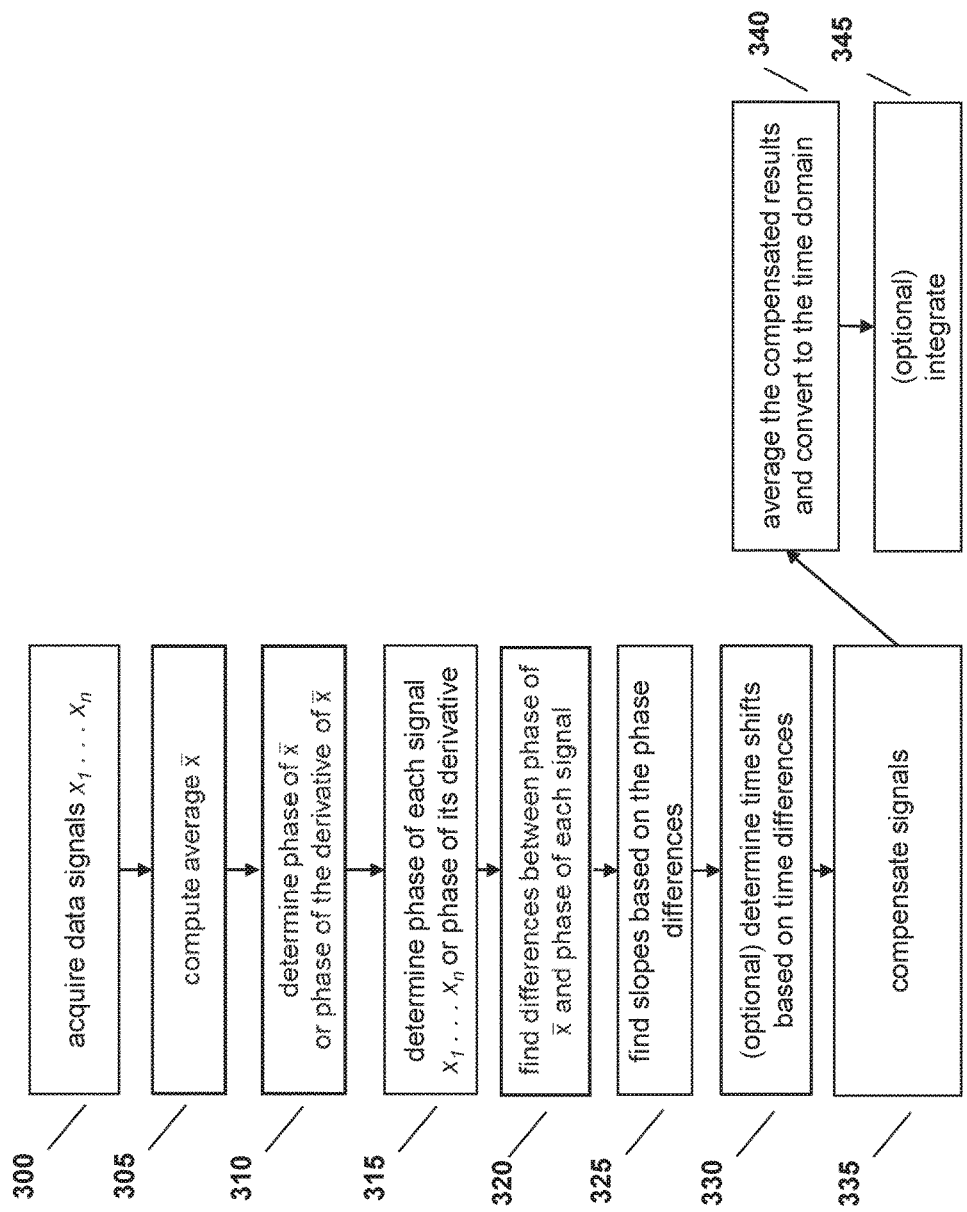
FIG. 3 depicts a method for compensating time shifts between data signals in accordance with one embodiment of the present invention.

FIG. 3 depicts an exemplary flowchart for performing group delay-based averaging according to one embodiment of the present invention. At step 300, two or more data signals ($x_1, \ldots, x_n$) are acquired. A direct average of all of the data signals is computed at step 305, to obtain an averaged signal $\bar{x}$.

In the embodiment shown in FIG. 3, the group delays are determined using by using phases of each signal. At step 310, the phase $\bar{\Phi}(f)$ of the averaged signal $\bar{x}$ is determined. In one embodiment, the phase is computed by performing a Fast-Fourier Transform (FFT) for the averaged signal $\bar{x}$. In another embodiment, the phase $\bar{\Phi}(f)$ is computed by taking a derivative of the averaged signal $\bar{x}$, and performing an FFT for the derivative of $\bar{x}$. In both embodiments, a windowing function may optionally be applied before performing the FFT. The windowing function improves performance by eliminating leakage into adjacent frequency bins.

At step 315, phases $\Phi(f)_i$ are computed for the individual data signals similar to step 310. In one embodiment, phases $\Phi(f)_i$ are computed by performing an FFT for each signal ($x_1, \ldots, x_n$). In embodiments where the derivative was used to determine $\bar{x}$ in step 310, the derivative of each signal must be computed at step 315 before performing an FFT to find the phase of each derivative. In both embodiments, a windowing function may optionally be applied before performing the FFTs.

In steps 310 and 315, the decision to perform an FFT on the signal or its derivative may depend on what type of data the signal contains. For example, when the starting and ending values of the signal are not close to each other (e.g., as in a step-like waveform), it may be preferable to use the signal's derivative. For other types of signals, using the signal itself may yield better results.

At step 320, a phase difference $\Delta\Phi(f)_i$ between each individual phase $\Phi(f)_i$ and the average phase $\bar{\Phi}$ is computed. In one embodiment, the phases found in steps 310 and 315 may be unwrapped and used to compute the phase difference for each individual signal. For example, the unwrapped average phase $\bar{\Phi}(f)$ may be subtracted from the unwrapped individual phases $\Phi(f)_i$ to obtain phase differences ($\Delta\Phi(f)_i, \ldots, \Delta\Phi(f)_n$). Any other suitable method of computing phase differences may also be used.

At step 325, the slope $\Delta\Phi_i(f)$ of each phase difference $\Delta\Phi(f)_i$ is computed. In one embodiment, a straight line fit may be performed using the Least Mean Squared (LMS) method. A weighting function may be optionally used when performing the LMS fit. For example, this phase plot is smoother at lower frequencies than it is at higher frequencies. To obtain a more accurate slope, it may be useful to weight the low frequency values more than the high frequency values.

The phase slopes may be compensated directly, or converted to time differences first. In embodiments where time differences are compensated, the slopes $\Delta\Phi_i(f)$ are first used to determine a time shift $\Delta t_i$ for each signal $x_1 \ldots x_n$ at step 330. For example, eq 1 above describes a relationship between slope and time shift. In one embodiment, the time shift $\Delta t_i$ for each signal may be determined by dividing the slope of that signal's phase difference by $2\pi*f$ (where f is the frequency). In other words:

$$\Delta t_i = \frac{\Delta \Phi_i(f)}{2\pi * f} \quad \text{(eq 2)}$$

At step 335, the signals are compensated. In embodiments where time shifts were computed at step 330, the time shifts $\Delta t_1 \ldots \Delta t_n$ are compensated. In one embodiment, the result of the FFT that was performed on each individual signal (or its derivative) $x_i, \ldots, x_n$ may be multiplied by exp $(j*2\pi*f*\Delta t_i)$ to obtain compensated FFT results $z_i, \ldots, z_n$ -where j represents the square root of negative one, f is frequency, and $\Delta t_i$ is the time shift of each signal. In other embodiments, the compensated FFT results $z_i, \ldots, z_n$ may be obtained by multiplying the FFT results by $\exp(j*\Delta\Phi_i(f))$ instead.

At step 340, the compensated FFT results $z_i, \ldots, z_n$ are averaged and converted to the time domain, in order to obtain an averaged time-domain result. In one embodiment, the compensated signals $z_i, \ldots, z_n$ are averaged to obtain an averaged result $\bar{z}$, and an inverse FFT (IFFT) is used to convert the averaged result $\bar{z}$ to the time domain. In another embodiment, an IFFT may be performed to convert each compensated signal $z_i, \ldots, z_n$ to the time domain first, before averaging the results of the IFFTs to obtain an averaged time-domain results $\bar{z}$.

In embodiments where the signals' derivatives were used in step 310 or 315, the averaged result obtained in step 335 is integrated at step 345 to return the averaged result to its correct form. Although the embodiment depicted in FIG. 3 uses phase and time derivatives, any known methods for determining and compensating group delays may be used instead.

The disclosed group delay based approach has several advantages. First, by compensating for time shifts, the disclosed technique improves overall SNR by preserving the averaged signal level at higher frequencies. Second, the disclosed techniques use FFT and IFFT, which are more computationally efficient than conventional approaches (such as cross-correlation methods) that must align the data signals before averaging them. Third, the disclosed techniques obtain an averaged result by using a Least Mean Squared (LMS) type of line fit, which results in a single value that can be used directly to compensate the time shifts. In comparison, conventional cross correlation methods require an extra interpolation step to find the value of the time shifts $\Delta t_i$. Fourth, the disclosed techniques use all of the data points in each data signal to obtain the value of $\Delta t_i$. In contrast, conventional methods based on edge-crossing only use a few data points around the edges of the waveform in each data signal. Finally, the disclosed techniques may be used to provide a computationally efficient manner of averaging a repeating data pattern, while providing more accurate results than traditional edge-based methods.

Figure 4:
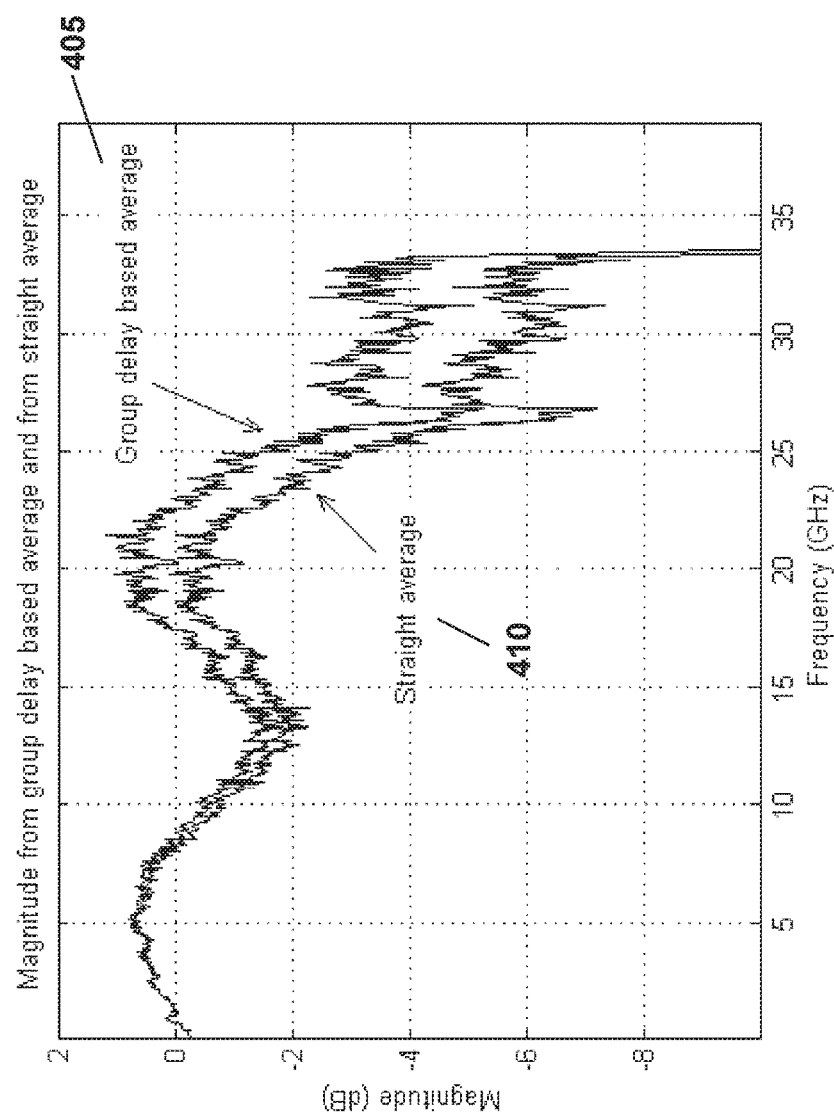
FIG. 4 depicts a magnitude plot obtained in accordance with the disclosed invention, compared with a magnitude plot obtained using prior art averaging techniques.

FIG. 4 depicts magnitude plots for a step like data signal that has gone through a derivative operation. As shown in FIG. 4, the magnitude of a group-delay based average result that was obtained in accordance with the present invention (shown by plot 405) is improved by about 2 dB at 30 GHz when compared to a conventionally-averaged result (shown by plot 410).

Figure 5:
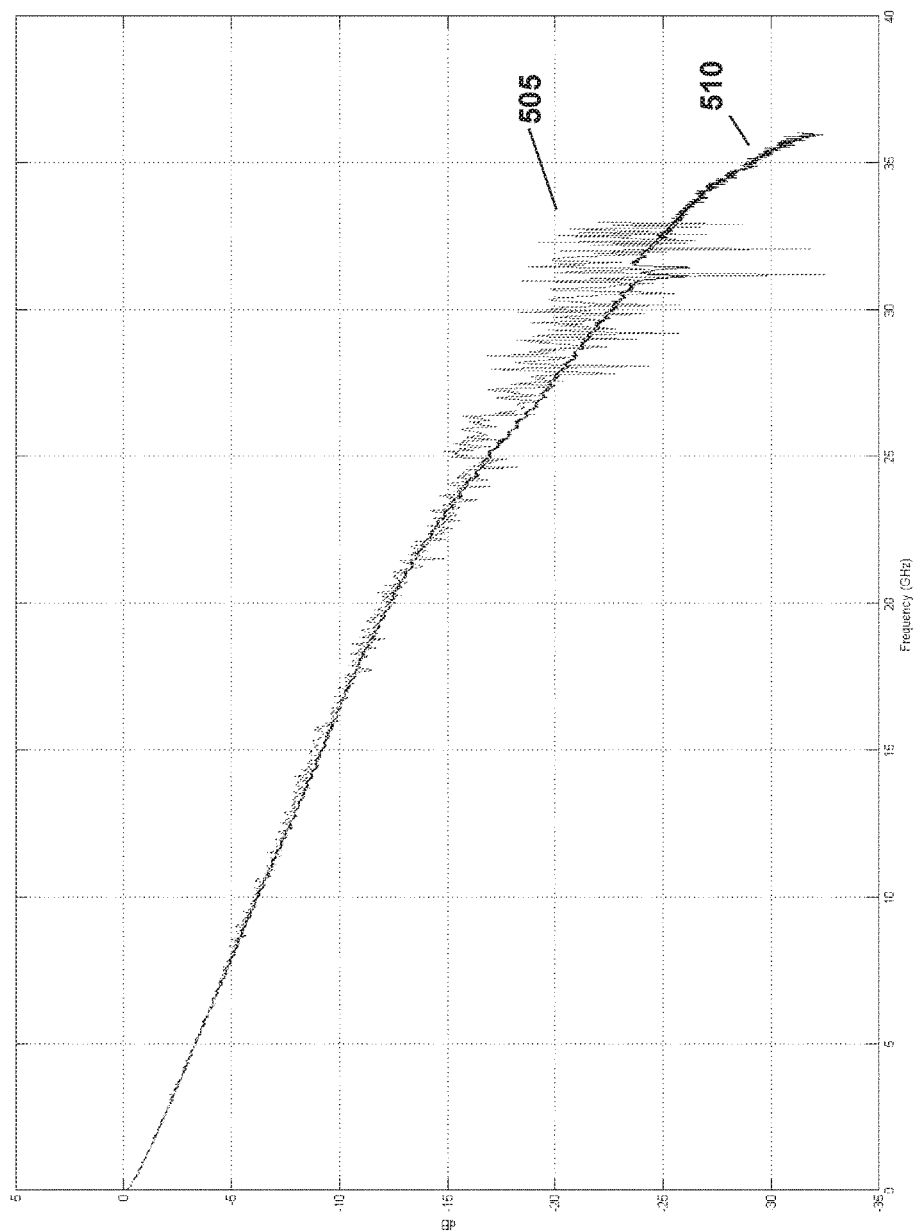
FIG. 5 depicts insertion loss measured in accordance with the disclosed invention, compared to insertion loss measured with a prior art VNA.

FIG. 5 depicts an insertion loss measurement result 505 obtained using a real-time oscilloscope in accordance with the present invention. As shown in FIG. 5, the insertion loss curve 505 correlates with an insertion loss measurement 510 that was taken with a VNA, for frequencies up to 25 GHz. This illustrates that the disclosed techniques enable a real-time oscilloscope to measure signals with similar accurately as a VNA, within a given range of frequencies.

Figure 6:
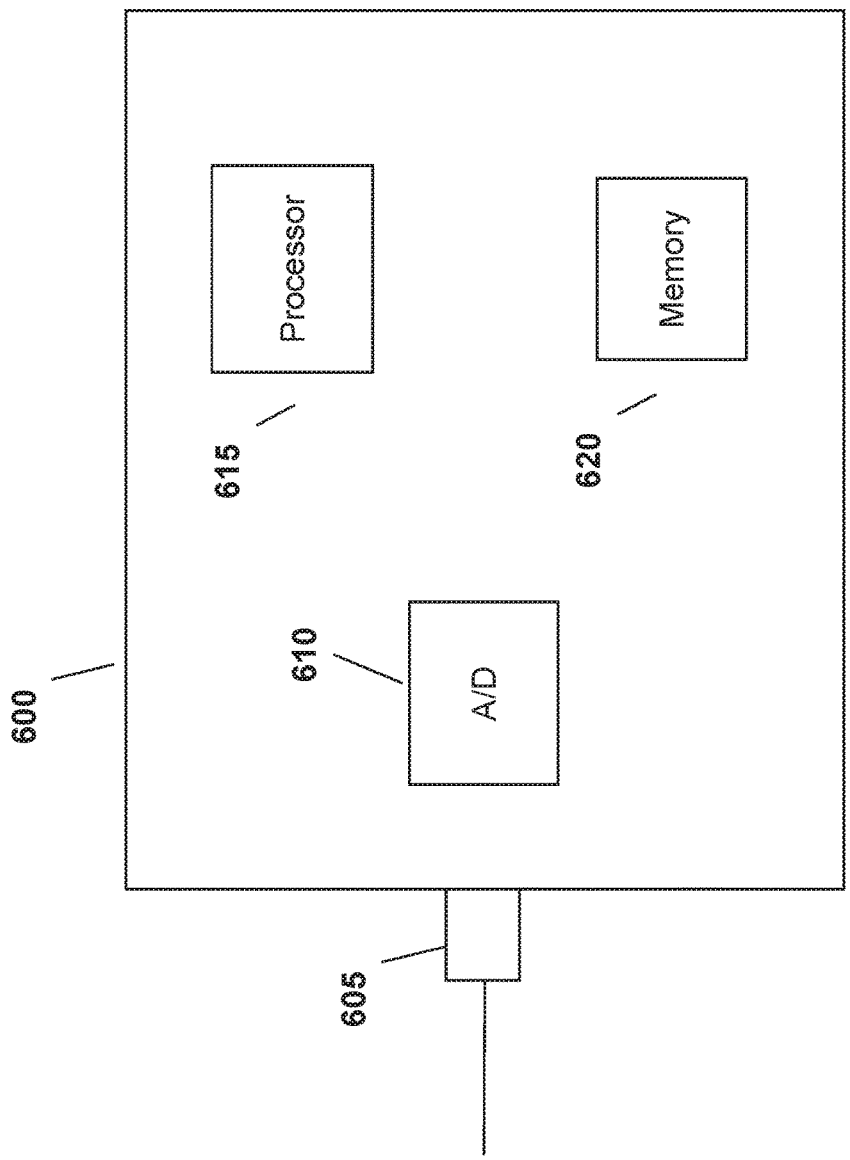
FIG. 6 depicts an exemplary instrument for performing clock recovery in accordance with the present invention.

In one embodiment, the improved group-delay based averaging techniques may be performed by an exemplary general-purpose device 600 such as a real-time oscilloscope—as depicted in FIG. 6. Device 600 may acquire data signals through a physical input 605 which may be a digital or analog input, or an interface such as a network, memory, or device interface. In embodiments where interface 605 receives analog signals, analog-to-digital (A/D) converter 610 may be used to convert the analog signal into a digital signal. In another embodiment, the data signal may be acquired from memory (for example, memory 620), or from another device. Memory 620 may store instructions that cause processor 615 to perform the improved group-delay based averaging techniques when executed. Memory 620 may also store data acquired from physical interface 605. The one or more intermediate or final results obtained during the disclosed methods may be stored in memory 620, output to a different device, or used for further operations by processor 615. Memory 620 may comprise one or more separate memories, including memory located in one or more other devices.

Although specific embodiments of the invention have been described for purposes of illustration, it will be apparent to those skilled in the art that various modifications may be made without departing from the spirit and scope of the invention. For example, the disclosed techniques are not limited to computing s-parameters in real-time oscilloscopes but may be used to compensate time shifts in any other instruments or devices, or for other types of signal processing. And, as previously discussed, any suitable methods may be used to determine and compensate for the group delays. Furthermore, any suitable method of determining or estimating derivatives may be used. For example, as is known in the art, a signal's derivative may be estimated by taking its difference. Although the term "data signal" has been used, it is understood that the present techniques may be performed on any type of acquired signal (i.e., "signal under test"). Likewise, one of ordinary skill in the art will understand the relationship between phase, delay, and group delay of a signal. Accordingly, the invention should not be limited except as by the appended claims.

What is claimed is:

1. A method for measuring an output from a device under test in a test and measurement instrument based on two or more signals under test from the device under test, comprising:
    acquiring at an interface the two or more signals under test from the device under test;
    determining an average signal based on the two or more signals under test;
    determining an average group delay for the average signal;
    determining individual group delays for each of the two or more signals under test;
    determining a difference between the average group delay and the individual group delay for each of the two or more signals under test;
    generating compensated signals by compensating each difference between the average group delay and the individual group delay for each of the two or more signals under test;
    averaging the compensated signals to produce an averaged result; and
    outputting the averaged result as the output from the device under test.

2. The method of claim 1, wherein:
determining the average group delay comprises determining a phase for the average signal;
determining individual group delays for each of the two or more signals under test comprises determining individual phases for each of the two or more signals under test; and
determining the difference between the average group delay and each of the individual group delays comprises determining differences between the average signal phase and the individual phases.

3. The method of claim 2, wherein determining the phase of the average signal comprises:
transforming the average signal from a time domain to a frequency domain by a fast Fourier transform; and
obtaining a phase from the transformation; and
wherein determining the phases of the two or more signals under test comprises transforming the two or more signals under test from a time domain to a frequency domain by a fast Fourier transform, and obtaining phases from the results of the transformation.

4. The method of claim 2, wherein determining the phase for the average signal comprises:
calculating a derivative of the average signal;
transforming the derivative of the average signal from a time domain to a frequency domain by a fast Fourier transform; and
obtaining a phase from the result of the transformation; and
wherein determining the phases of the two or more signals under test comprises:
calculating derivatives of the two or more data signals;
transforming the derivatives from a time domain to a frequency domain by a fast Fourier transform; and
obtaining phases from the results of the transformation.

5. The method of claim 2, wherein determining the phase differences comprises:
unwrapping the phase of the average signal;
unwrapping the phases of the two or more signals under test; and
determining the phase differences by subtracting the unwrapped phase of the average signal from each of the unwrapped phases of the two or more signals under test.

6. The method of claim 2, wherein the differences comprise first differences and compensating the differences comprises:
performing a straight-line fit for each of the differences by using a least mean squared method;
obtaining second differences based at least in part on the slopes of the straight-line fit; and
compensating the second differences.

7. The method of claim 6, wherein compensating the differences further comprises:
determining time shifts for the two or more signals under test based on the second differences; and
multiplying the results of the transformations to the frequency domain of the two or more signals under test by $\exp(j*2\pi*f*\Delta t_i)$, where j represents the square root of negative 1, f represents frequency, and $\Delta t_i$ represents the time shifts.

8. The method of claim 3, wherein transforming the average signal from the time domain to the frequency domain by the fast Fourier transform comprises determining a derivative of the average signal and transforming the derivative of the average signal from a time domain to a frequency domain by a fast Fourier transform; and wherein transforming the two or more signals under test to the frequency domain comprises determining derivatives of each of the two or more signals under test and transforming the derivatives from a time domain to a frequency domain by a fast Fourier transform.

9. The method of claim 4, wherein outputting the averaged result further comprises integrating the averaged result.

10. The method of claim 2, wherein averaging the compensated signals to produce the averaged result comprises;
averaging the compensated signals in the frequency domain to produce an averaged frequency-domain result; and
producing an averaged result by the averaged frequency-domain result to a time domain by an inverse fast Fourier transform.

11. The method of claim 2, wherein averaging the compensated signals to produce an averaged result comprises;
generating time-domain compensated signals by transforming each compensated signal to a time domain by an inverse fast Fourier transform; and
averaging the time-domain compensated signals to produce an averaged result.

12. A test and measurement instrument configured to compute a group-delay based averaged result of two or more signals under test, comprising:
a physical interface configured to obtain the two or more signals under test;
memory configured to store digital representations of the two or more signals under test, and the averaged result;
a processor, configured to:
determine an average signal based on the two or more signals under test;
determine an average group delay for the average signal;
determine individual group delays for each of the two or more signals under test;
determine a difference between the average group delay and the individual group delay for each of the two or more signals under test;
generate compensated signals by compensating each difference between the average group delay and the individual group delay for each of the two or more signals under test; and
average the compensated signals to produce an averaged result.

13. The test and measurement instrument of claim 12, further comprising an analog-to-digital converter configured to convert the two or more signals under test to two or more digital signals under test.

14. The test and measurement instrument of claim 12, wherein the process is further configured to:
determine the average group delay by determining a phase for the average signal;
determine individual group delays for each of the two or more signals under test by
determining individual phases for each of the two or more signals under test; and
determining the difference between the average group delay and each of the individual group delays comprises determining differences between the average signal phase and the individual phases.

15. The test and measurement instrument of claim 14, wherein the processor is further configured to determine the phase of the average signal by:
transforming the average signal from a time domain to a frequency domain by a fast Fourier transform; and
obtaining a phase from the transformation; and wherein determining the phases of the two or more signals under test comprises transforming the two or more signals under test from a time domain to a frequency domain by a fast Fourier transform, and obtaining phases from the results of the transformation.

16. The test and measurement instrument of claim 14, wherein the processor is configured to determine determining the phase for the average signal bu:
   calculating a derivative of the average signal;
   transforming the derivative of the average signal from a time domain to a frequency domain by a fast Fourier transform; and
   obtaining a phase from the result of the transformation; and
   wherein the processor is configured to determine the phases of the two or more signals under test by:
   calculating derivatives of the two or more data signals;
   transforming the derivatives from a time domain to a frequency domain by a fast Fourier transform; and
   obtaining phases from the results of the transformation.

17. The test and measurement instrument of claim 14, wherein the processor is further configured to determine the phase differences comprises:
   unwrapping the phase of the average signal;
   unwrapping the phases of the two or more signals under test; and
   determining the phase differences by subtracting the unwrapped phase of the average signal from each of the unwrapped phases of the two or more signals under test.

18. The test and measurement instrument of claim 14, wherein the differences comprise first differences and the processor is further configured to compensate the differences by:
   performing a straight-line fit for each of the differences by using a least mean squared method;
   obtaining second differences based at least in part on the slopes of the straight-line fit; and
   compensating the second differences.

19. The test and measurement instrument of claim 18, wherein the processor is further configured to compensate the differences by:
   determining time shifts for the two or more signals under test based on the second differences; and
   multiplying the results of the transformations to the frequency domain of the two or more signals under test by $\exp(j^* 2\pi^* f^* \Delta t_i)$, where j represents the square root of negative 1, f represents frequency, and $\Delta t_i$ represents the time shifts.

20. The test and measurement instrument of claim 15, wherein transforming the average signal from the time domain to the frequency domain by the fast Fourier transform includes determining a derivative of the average signal and transforming the derivative of the average signal from a time domain to a frequency domain by a fast Fourier transform; and
   wherein transforming the two or more signals under test to the frequency domain comprises determining derivatives of each of the two or more signals under test and transforming the derivatives from a time domain to a frequency domain by a fast Fourier transform.

* * * * *

UNITED STATES PATENT AND TRADEMARK OFFICE
CERTIFICATE OF CORRECTION

PATENT NO.        : 10,345,339 B2
APPLICATION NO.   : 15/143429
DATED             : July 9, 2019
INVENTOR(S)       : Kan Tan and John J. Pickerd Page 1 of 1

It is certified that error appears in the above-identified patent and that said Letters Patent is hereby corrected as shown below:

In the Claims

Claim 16, Column 9, Line 8, replace "bu" with --by--

Signed and Sealed this
Twenty-first Day of April, 2020

Andrei Iancu
*Director of the United States Patent and Trademark Office*